United States Patent
Kim et al.

(10) Patent No.: US 10,580,715 B2
(45) Date of Patent: Mar. 3, 2020

(54) STRESS BUFFER LAYER IN EMBEDDED PACKAGE

(71) Applicant: TEXAS INSTRUMENTS INCORPORATED, Dallas, TX (US)

(72) Inventors: Woochan Kim, Sunnyvale, CA (US); Masamitsu Matsuura, Oita (JP); Mutsumi Masumoto, Oita (JP); Kengo Aoya, Oita (JP); Hau Thanh Nguyen, San Jose, CA (US); Vivek Kishorechand Arora, San Jose, CA (US); Anindya Poddar, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/008,119

(22) Filed: Jun. 14, 2018

(65) Prior Publication Data

US 2019/0385924 A1  Dec. 19, 2019

(51) Int. Cl.
| | |
|---|---|
| *H01L 23/10* | (2006.01) |
| *H01L 23/34* | (2006.01) |
| *H01L 23/367* | (2006.01) |
| *H01L 21/56* | (2006.01) |
| *H01L 23/00* | (2006.01) |
| *H01L 23/373* | (2006.01) |

(52) U.S. Cl.
CPC .......... *H01L 23/3675* (2013.01); *H01L 21/56* (2013.01); *H01L 24/25* (2013.01); *H01L 23/3736* (2013.01); *H01L 2224/24137* (2013.01); *H01L 2224/2518* (2013.01)

(58) Field of Classification Search
CPC .......... H01L 2225/06589; H01L 23/36; H01L 23/367; H01L 23/373
USPC .................. 257/706, 707, 782; 438/118, 122
See application file for complete search history.

(56) References Cited

U.S. PATENT DOCUMENTS

| | | | | |
|---|---|---|---|---|
| 5,724,818 | A  * | 3/1998 | Iwata ...................... | H01L 23/38 257/E23.082 |
| 7,299,639 | B2 * | 11/2007 | Leija ....................... | H01L 23/38 257/E23.082 |
| 9,583,474 | B2 * | 2/2017 | Lin ........................ | H01L 23/36 |
| 2009/0072385 | A1 * | 3/2009 | Alley ..................... | H01L 23/38 257/713 |

(Continued)

*Primary Examiner* — S. V. Clark
(74) *Attorney, Agent, or Firm* — Dawn Jos; Charles A. Brill; Frank D. Cimino

(57) ABSTRACT

The disclosed principles provide a stress buffer layer between an IC die and heat spreader used to dissipate heat from the die. The stress buffer layer comprises distributed pairs of conductive pads and a corresponding set of conductive posts formed on the conductive pads. In one embodiment, the stress buffer layer may comprise conductive pads laterally distributed over non-electrically conducting surfaces of an embedded IC die to thermally conduct heat from the IC die. In addition, such a stress buffer layer may comprise conductive posts laterally distributed and formed directly on each of the conductive pads. Each of the conductive posts thermally conduct heat from respective conductive pads. In addition, each conductive post may have a lateral width less than a lateral width of its corresponding conductive pad. A heat spreader is then formed over the conductive posts which thermally conducts heat from the conductive posts through the heat spreader.

20 Claims, 11 Drawing Sheets

(56) References Cited

U.S. PATENT DOCUMENTS

2016/0084542 A1* 3/2016 Kim .................. F25B 21/02
62/3.7

* cited by examiner

STRESS BUFFER LAYER IN EMBEDDED PACKAGE

TECHNICAL FIELD

The present disclosure relates to embedded packages and their manufacturing techniques, and more particularly relates to the addition of a stress buffer layer in embedded packages and related methods for manufacturing such a stress buffer layer.

BACKGROUND

Integrated circuit (IC) dies are encapsulated in protective packages to allow easy handling and assembly onto printed circuit boards (PCBs) and to protect the dies or related components and devices from damage. A dielectric material, such as a hard plastic, is typically used to encapsulate the dies and related components to form the package. A variety of different IC package types exist, and several types include heat spreaders formed on one or more sides (typically the top side) of the package. Specifically, heat spreaders are interconnected to the encapsulated dies, and possibly other encapsulated components, to function as a heat sink and thereby assist in drawing heat out of the package.

As might be expected, the technique for physically (and thus thermo-conductively) connecting the heat spreader to the encapsulated die(s) and other components is crucial in ensuring proper heat dissipation. Cracks or other physical failures between the underlying dies and the heat spreader can result in insufficient heat dissipation, which may result in die overheating and in turn, die failure. This is usually caused due to a mismatch in the coefficient of thermal expansion (CTE) of the silicon typically used to form the underlying dies (a CTE of 3 ppm/K) and of copper typically used to form the heat spreader (a CTE of 16 ppm/K). Thus, multiple techniques and structures for physically connecting the encapsulated dies with a heat spreader exist; however, even the more popular conventional approaches can suffer catastrophic failure.

One conventional approach is to directly contact the top (e.g., via a thermal pad) of an encapsulated die with the heat spreader. Looking at FIG. 1, illustrated is a cross-sectional view of a block diagram of a conventional IC package 100 providing a direct connection between a die and a heat spreader. Specifically, the package 100 is comprised of a circuit layer 105 and a redistribution layer (RDL) 110. The circuit layer 105 includes the IC dies 115, as well as other components such as a drive IC 120. The RDL 110 typically includes a number of conductive vias 122, such as metal pillars, and interconnects 124, such as a metal leadframe, to provide electrical connection to electrically conductive bond pads on the die 115 and other components to other underlying circuitry.

The package 100 also includes a heat spreader 125, which is typically composed of copper due to its excellent thermal-conductivity. In order to dissipate the heat from the die 115 to the heat spreader 125, an interface 130 provided by the direct physical connection between the two exists. In some embodiments, a plain metal layer, which is typically also copper, may be provided as the direct interface 130 of the die 115 and the heat spreader 125. However, due to the large mismatch in CTE at the direct interface 130 between the silicon of the die 115 and the copper of the heat spreader 125 (or metal layer), cracks typically develop at their interface 130 when the package 100 is subjected to high temperatures. For example, embedded packages are typically heated to a temperature above the solder melting temperature, typically during an infrared (IR) reflow process, to remove moisture the plastic encapsulant may have absorbed during the manufacturing process. During such an IR reflow process, the CTE mismatch between the heat spreader 125 and the top surface of the die 115 can result in such cracking, with this loss in structural integrity often significantly affecting the heat dissipation capabilities of the heat spreader. Such cracking may also occur in response to the high temperatures experienced in extreme operating conditions for the package 100.

Turning to FIG. 2, illustrated is an image from a scanning electron microscope (SEM) of a used conventional package 200 employing a direct physical connection between an encapsulated die and a heat spreader. As with the diagram in FIG. 1, the package 200 in FIG. 2 also includes a circuit layer 205 as well as an RDL 210. An IC die 215 can be seen encapsulated within a dielectric material in the circuit layer 205. The scan also shows a copper heat spreader 225 directly connected to the top of the die 215 for heat dissipation. Over time, a large crack 230 can be seen formed at the interface between the die 215 and the heat spreader 225 caused by the mismatch in thermal expansion between these two components of the package 200. FIG. 2A provides a close up view of a portion of the package 200 in FIG. 2. In this close up view, the crack 230 proximate to the interface between the die 215 and the heat spreader 225 can be easily be seen. Consequently, the ability of the heat spreader 225 of this conventional package 200 to dissipate heat from the die 215 has been compromised.

Looking now at FIG. 3, illustrated is a cross-sectional view of a block diagram of another conventional IC package 300 providing an indirect connection between a die and a heat spreader. This conventional package 300 again includes a circuit layer 305 and an RDL 310. The circuit layer 305 includes an IC die 315 in need of heat dissipation using a heat spreader 325. In this conventional approach, thermally conductive vias 335 are used to provide a physical, and thus thermal, connection between the die 315 and the heat spreader 325. To provide good thermal conductivity, the vias 335 are also typically formed of copper along with the heat spreader 325, again due to copper's good thermal conductivity. In addition, a thin conductive seed layer 340, usually copper as well, may also be formed on top of the die 315 to assist with thermal conductance across the top of the die 315, as well as provide contact with the bottoms of the conductive vias 335.

Unfortunately, as with the prior approach, this second conventional approach also suffers from structural disadvantages. In particular, although the conductive vias 335 and the seed layer 340 are both typically formed of copper, the interfaces where the vias 335 contact the seed layer 340 still suffer from mechanical failure. Specifically, the interface between the bottoms of each conductive via 335 and the top of the die 315 typically suffer structural failure, again usually in the form of cracks, not due necessarily to CTE mismatch, but instead due to high thermo-mechanical stress resulting from the relatively small diameter for each of the bottoms of the conductive vias 335 even though connected to the similar composition seed layer 340. This typically again occurs when the package 300 undergoes through an IR reflow process. This loss in structural integrity can again significantly affecting the heat dissipation capabilities of the heat spreader 375.

Turning briefly to FIG. 3A, provided is an SEM image 350 of a used conventional package employing conductive vias between an encapsulated die and a heat spreader. The image 350 shows this embodiment of a conventional package also includes a circuit layer 355 and RDL 360, with a silicon IC die 365 encapsulated in the circuit layer 355. The heat spreader 375 can be seen located above and spaced from the die 365, with copper vias 385 providing physical, and thus thermal, connections between the die 365 and the heat spreader 375. In addition, a thin conductive seed layer 390 can also be seen deposited over the top of the die 365 to assist with heat dissipation, with the copper vias 385 being physically connected to the top of the seed layer 390 at interfaces 380.

However, as mentioned above, structural failure in the form of cracks still typically form at the interfaces 380 between the vias 385 and seed layer 390 after the package undergoes an IR reflow process or other cause of similar high temperatures. This is caused by the downwardly tapered sidewalls of the vias 385 that result from the formation process employed to form the conductive vias 385. Specifically, once dielectric material is deposited on and around the circuit layer 355 to encapsulate the die 365 and other components and interconnects in the circuit layer 355, the encapsulation material is deposited to a predetermined height about the die 365. Then, laser drilling is used to form the vias 385 by drilling down through the encapsulation material to reach the top of the die 365 or the top of the seed layer 390. Typical metal deposition techniques may then be used to fill the drilled holes with copper to form the vias 385. Thereafter, copper deposition may again be used to form the heat spreader 325 on top of the encapsulation material, and in contact with the tops of the copper vias 385.

Unfortunately, the laser drilling process create via openings that are tapered from their tops to their bottoms. As a result, the filled conductive vias 385 have a corresponding downward, cylindrical tapering. This tapering of the vias 385 results in a via structure with a narrow diameter at the interface 380 with the die 365 or seed layer 390. These conventional tapered via 385 structures result in less overall copper surface area conducting heat from the seed layer 390 or die 365, which results is less heat dissipation. In addition, this relatively narrow interface 380 results in a high thermo-mechanical stress at the interface 380 of each via 385, for example, after the package undergoes a reflow process. Consequently, similarly to the direct conductive connection of the other conventional approach discussed above, the high thermo-mechanical stress at the interfaces 380 will result in cracks being formed their interfaces 380 of the bottom of each via 385, especially in extreme operating conditions for the package 300. Also as before, such cracks result in mechanical failure for the heat dissipation intended to be provided by the conductive vias 385. Furthermore, the inwardly tapered structure of the bottom portions of the vias 385 provides less overall thermal conductive surface contacting the die 365 or a seed layer 390 over the top surface of the die 365

Accordingly, what is needed in the art is a dissipation structure for encapsulated packages, and related methods for manufacturing such dissipation structures, that do not suffer from the deficiencies of the prior art. The disclosed principles provides these and other improvements.

SUMMARY

The disclosed principles provide for the creation of a stress buffer layer between an embedded IC die and a heat spreader used to dissipate heat from non-electrically conductive surfaces of the IC die. The stress buffer layer is comprised of a distributed set of conductive pads and a corresponding set of conductive posts formed on the conductive pads. In particular, the conductive pads will typically have a substantially larger width or diameter than the conductive posts. The relatively large diameter of the conductive pads provides a much larger interface between the conductive pads and either the top of the embedded die directly, or a conductive seed layer if one is used, and thus reduces the thermo-mechanical stress at the interface at the die associated with a CTE mismatch found in some conventional approaches discussed above. Also, the large diameter of the conductive pads eliminates the high thermo-mechanical stress present when narrow, tapered conductive vias are formed using the conventional laser drilling technique discussed above.

Thus, in one aspect, the disclosed principles are directed to a stress buffer layer for use in dissipating heat within an embedded IC package. For example, a stress buffer layer as disclosed herein may comprise a plurality of conductive pads laterally distributed over an IC die encapsulated in an IC package. Each of the plurality of conductive pads may have a proximal end contacting a non-electrically conductive surface of the IC die, and having a distal end opposite each proximal end of each conductive pad. In addition, such a stress buffer layer may further comprise a plurality of conductive posts laterally distributed and formed directly on each of the plurality of conductive pads. Each of the plurality of conductive posts may have proximal end contacting respective distal ends of each conductive pad, and a distal end opposite each proximal end of each conductive post. Also, each conductive post may have a lateral width less than a lateral width of its corresponding conductive pad. Moreover, the structure for dissipating heat from the die may further comprise a heat spreader formed over the plurality of conductive posts. The heat spreader may have a proximal surface contacting the distal ends of the plurality of conductive posts, and a distal surface exposed from the IC package.

In another aspect, the disclosed principles are directed to methods for manufacturing a stress buffer layer that is used in dissipating heat from an embedded IC die from within an IC package. For example, a disclosed method may comprise depositing a first mask layer over an IC die, and then removing areas of the first mask layer to create first openings exposing corresponding non-electrically conductive surfaces of the IC die. The method may then include forming a conductive pad in each of the first openings over the exposed corresponding non-electrically conductive surfaces of the IC die and to a height of the first mask layer. An exemplary method may then include depositing a second mask layer over the conductive pads and remaining portions of the first mask layer, and then removing areas of the second mask layer to create second openings, each exposing a portion of a corresponding conductive pad. A conductive post may then be formed in each of the second openings directly on the exposed portion of each corresponding conductive pad. An exemplary method may then include removing the first and second mask layers, and depositing an encapsulating dielectric material over the IC die, conductive pads, and conductive posts to a height of the conductive posts. Then, a heat spreader maybe formed on the encapsulating dielectric material and the conductive posts, and with a distal surface of the heat spreader exposed from the encapsulating dielectric material.

BRIEF DESCRIPTION OF THE DRAWINGS

The novel features believed characteristic of the disclosure are set forth in the appended claims. The invention itself, however, as well as a preferred mode of use, further objectives and advantages thereof, will be best understood by reference to the following detailed description of illustrative embodiments when read in conjunction with the accompanying drawings, wherein:

DETAILED DESCRIPTION

The various embodiments of the presently disclosed subject matter are described with specificity to meet statutory requirements. However, the description itself is not intended to limit the scope of this patent. Rather, it has been contemplated that the claimed subject matter might also be embodied in other ways, to include different steps or elements similar to the ones described in this document, in conjunction with other present or future technologies. The components described hereinafter as making up various elements of the invention are intended to be illustrative and not restrictive. Many suitable components that would perform the same or similar functions as the components described herein are intended to be embraced within the scope of the invention. Such other components not described herein can include, but are not limited to, for example, similar components that are developed after development of the presently disclosed subject matter.

It should also be noted that, as used in the specification and the appended claims, the singular forms "a," "an" and "the" include plural references unless the context clearly dictates otherwise. References to a composition containing "a" constituent is intended to include other constituents in addition to the one named. Also, in describing the preferred embodiments, terminology will be resorted to for the sake of clarity. It is intended that each term contemplates its broadest meaning as understood by those skilled in the art and includes all technical equivalents which operate in a similar manner to accomplish a similar purpose.

Also, the use of terms herein such as "having," "has," "including," or "includes" are open-ended and are intended to have the same meaning as terms such as "comprising" or "comprises" and not preclude the presence of other structure, material, or acts. Similarly, though the use of terms such as "can" or "may" is intended to be open-ended and to reflect that structure, material, or acts are not necessary, the failure to use such terms is not intended to reflect that structure, material, or acts are essential. To the extent that structure, material, or acts are presently considered to be essential, they are identified as such.

It is also to be understood that the mention of one or more method steps does not preclude the presence of additional method steps or intervening method steps between those steps expressly identified. Moreover, although the term "step" may be used herein to connote different aspects of methods employed, the term should not be interpreted as implying any particular order among or between various steps herein disclosed unless and except when the order of individual steps is explicitly required.

Figure 1:
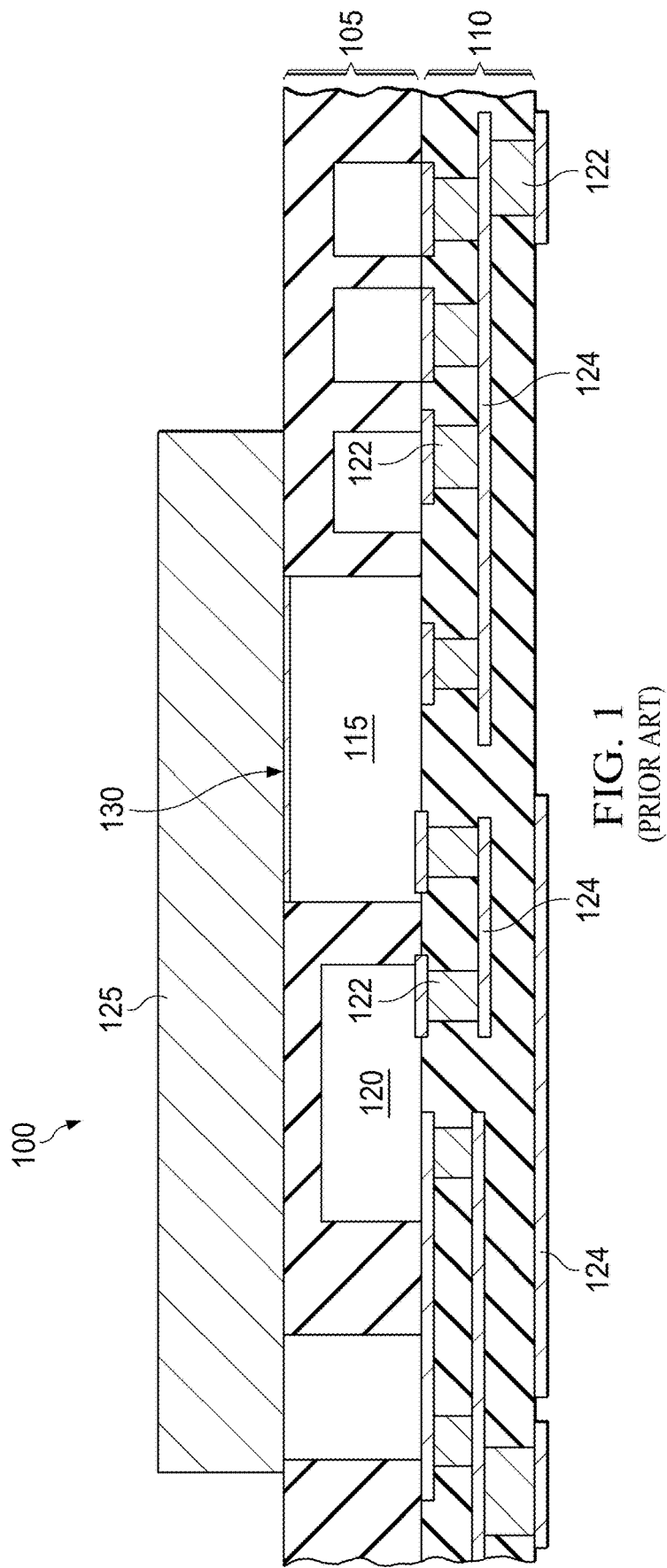
FIG. 1 illustrates a cross-sectional view of a block diagram of a conventional IC package providing a direct connection between a die and a heat spreader.
Figure 2:
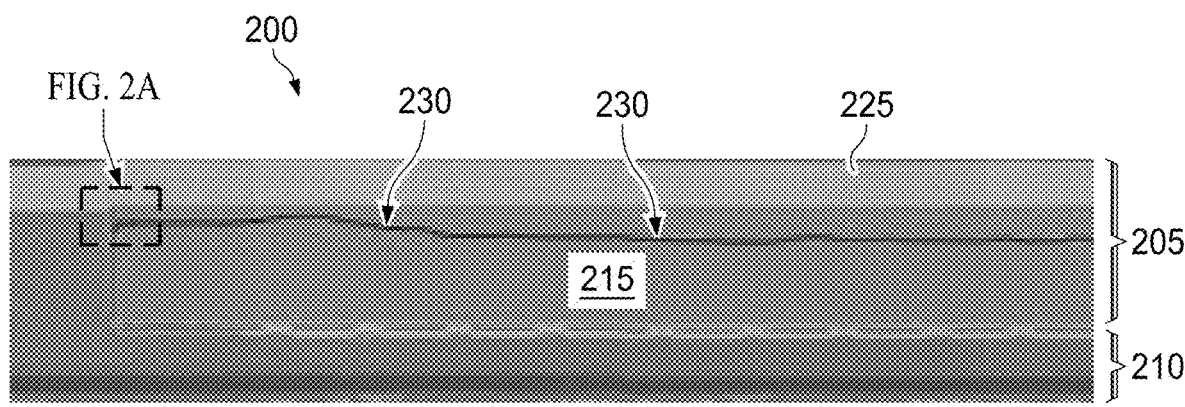
FIG. 2 illustrates an image from a scanning electron microscope of a used conventional package employing a direct physical connection between an encapsulated die and a heat spreader.
Figure 2A:
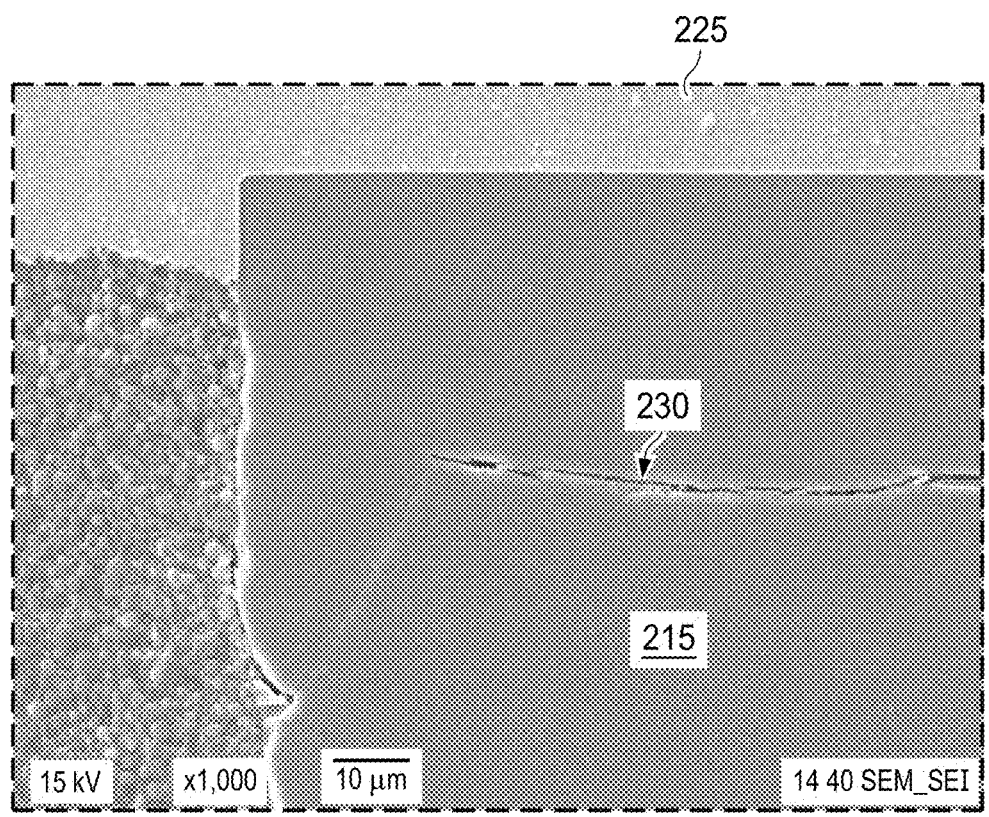
FIG. 2A provides a close up view of a portion of the conventional package in FIG. 2.
Figure 3:
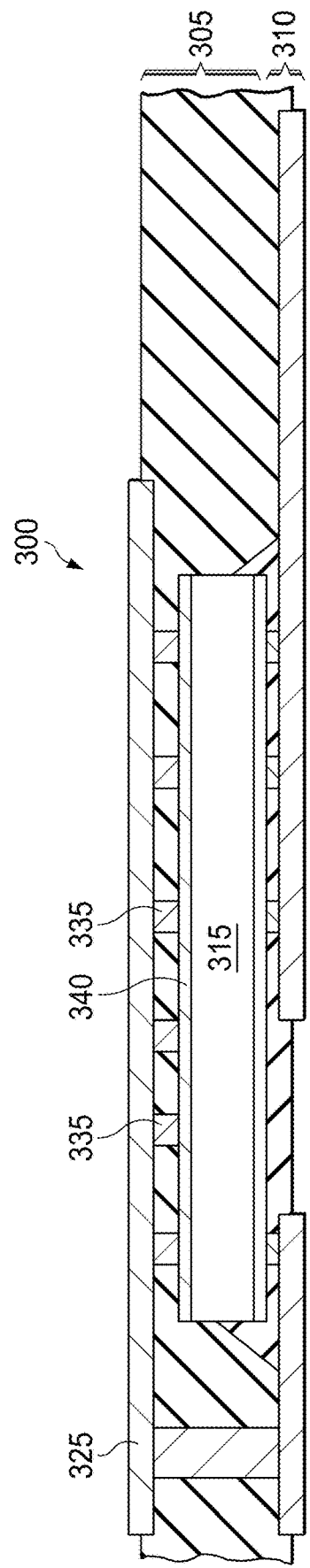
FIG. 3 illustrates a cross-sectional view of a block diagram of another conventional IC package providing an indirect connection between a die and a heat spreader.
Figure 3A:
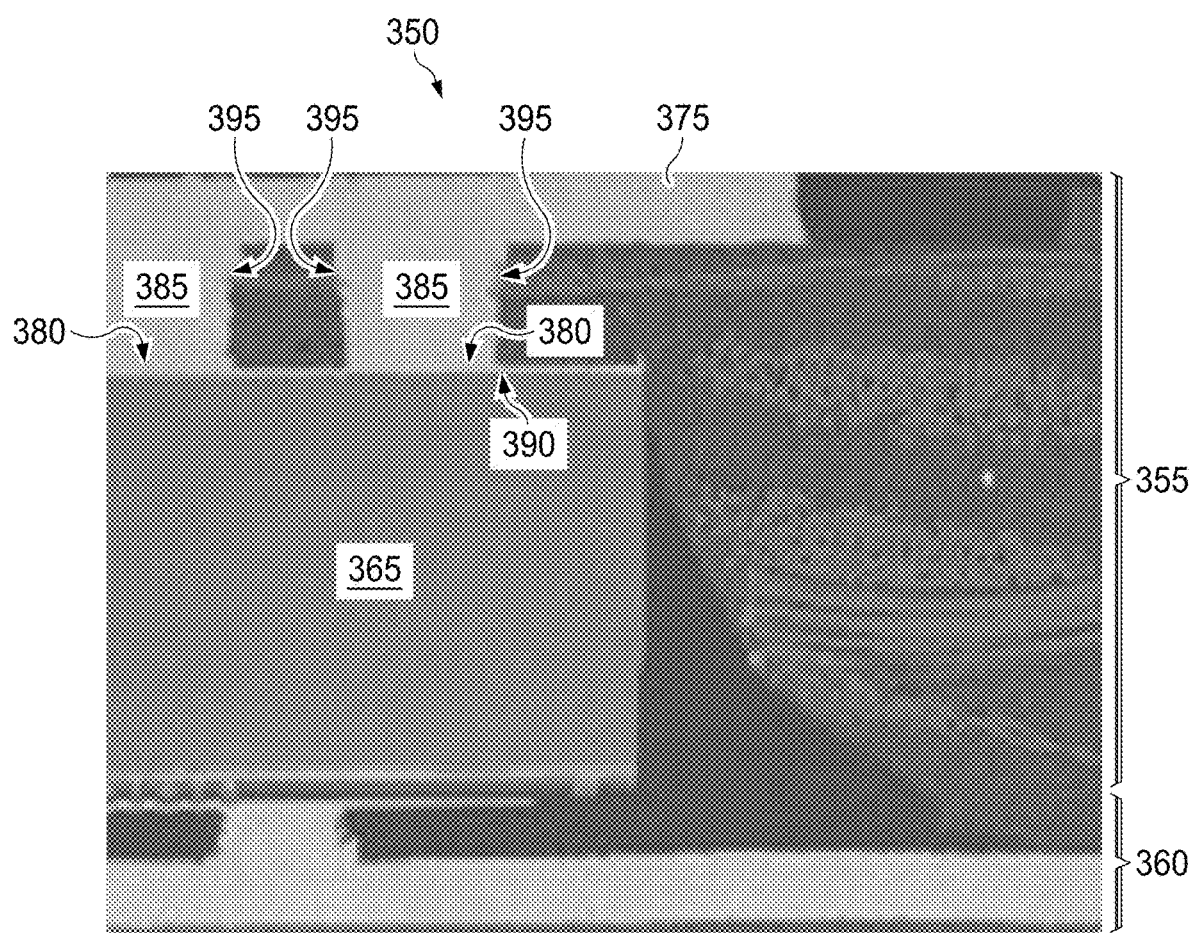
FIG. 3A provides an image from a scanning electron microscope of a used conventional package employing conductive vias between an encapsulated die and a heat spreader.
Figure 4:
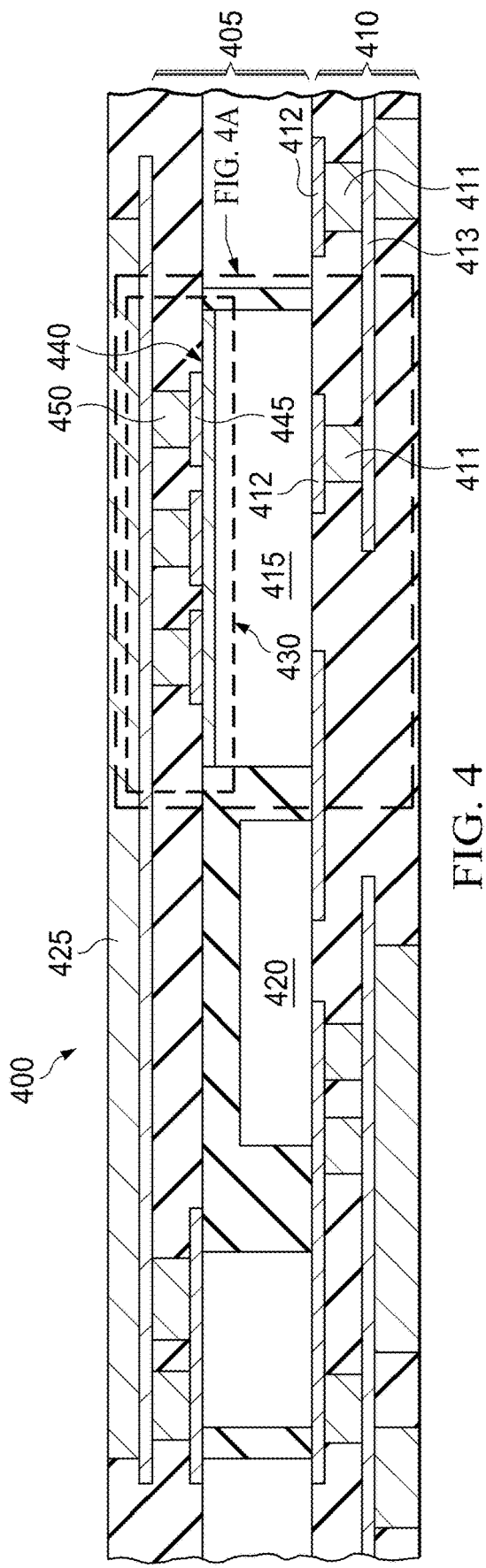
FIG. 4 illustrates a cross-sectional view of a block diagram of an embedded IC package having a heat dissipation structure constructed in accordance with the disclosed principles.

Referring now to FIG. 4, illustrated is a cross-sectional view of a block diagram of an embedded IC package 400 having a heat dissipation structure constructed in accordance with the disclosed principles. The embedded IC package 400 includes a circuit layer 405 and an RDL 410, and may be embodied as Quad Flat No-leads (QFN), Small Outline No-Lead (SON) (e.g., very small outline no-lead (VSON) or very, very small outline no-lead (WSON) packages), Land Grid Array (LGA), or other advantageous package; however, the disclosed principles may be employed with any type of embedded package employed a heat spreader or other heat dissipation structure. Within the circuit layer 405, an IC die 415 is encapsulated in a dielectric material, as is a drive IC 420. Within the RDL 410 are electrically conductive vias 411 connected to electrically conductive bond pads 412 formed on an active side of the IC die 415. An electrically conductive leadframe 413 is also shown connected to the conductive vias 411 for distributing electrical signals within the RDL 410.

Located above the circuit layer 405 is a heat spreader 425, which as before may be constructed of copper. Physically, and thermally, connecting the embedded die 415 to the heat spreader 425 is a stress buffer layer 430 constructed in accordance with the disclosed principles. In particular, the design and structure of the disclosed stress buffer layer 430 reduces thermo-mechanical stress at the connection to the IC die. The heat dissipation structure may again include an optional seed layer 440 deposited on top of the die 415, which again can improve heat dissipation from the die 415. The unique structure of the disclosed stress buffer layer 430 comprises a combination of a thermally conductive pad 445 with a conductive post 450. Specifically, a proximal end of each conductive pad 445 is in contact with non-electrically conductive surface(s) of the die 415 or seed layer 440 over the non-electrically conductive surface(s), while the distal end of each conductive pad 445 is directed away from the die 415. Such non-electrically conductive surface(s) may include any surface of the die 415 not having electrically conductive bond pads used to electrically communicate to or from circuitry within the die 415. Each conductive post 450 has its proximal end in contact with the distal end of each corresponding conductive pad 445, while the distal end of each conductive post 450 is directed away from the conductive pads 445. Then, the distal end of each conductive post 450 is in contact with the heat spreader 425, or an optional seed layer (see FIG. 4A) placed between the heat spreader 425 and each conductive post 450. The heat spreader 425 then includes a distal surface exposed from the IC package 400.

In an exemplary embodiment, both the pads 445 and posts 450 are formed of the same material to improve their bonding to one another, such as both being formed of copper due to its high thermal conductivity. However, other thermally conductive materials may also be employed with the disclosed principles. In another embodiment, the conductive pads 445 may have a substantially annular or substantially cylindrical shape, but other shapes for the conductive pads 445 may also be employed. As illustrated, the disclosed principles also provide that the conductive pads 445 have a substantially larger width or diameter than the conductive posts 450. Advantageously, the relatively large diameter of the conductive pads 445 provides a much larger interface between the pads 445 and either the top, non-electrically conductive surfaces of the die 415 directly, or a conductive seed layer 440 if present, which reduces the thermo-mechanical stress at the interface at the die 415 associated with a CTE mismatch found in some conventional approaches. However, the diameters of the conductive pads 445 are not so large as to substantially equate to the contact area of a heat spreader disposed directly on the die 415. Also, the large diameter of the conductive pads 445 eliminates the high thermo-mechanical stress present when narrow, tapered conductive vias are formed using the conventional laser drilling technique discussed above.

Figure 4B:
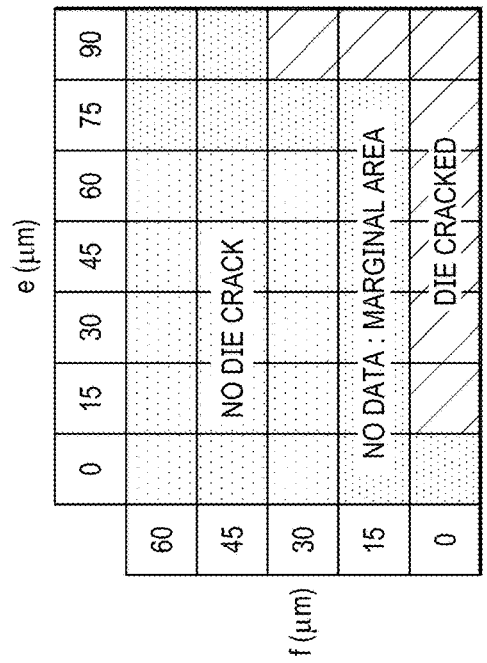
FIG. 4B illustrates a chart providing a summary of the DOE results of the development of thermo-mechanical stress cracks at the interface with an embedded die constructed with a stress buffer layer according to the disclosed principles.
Figure 4A:
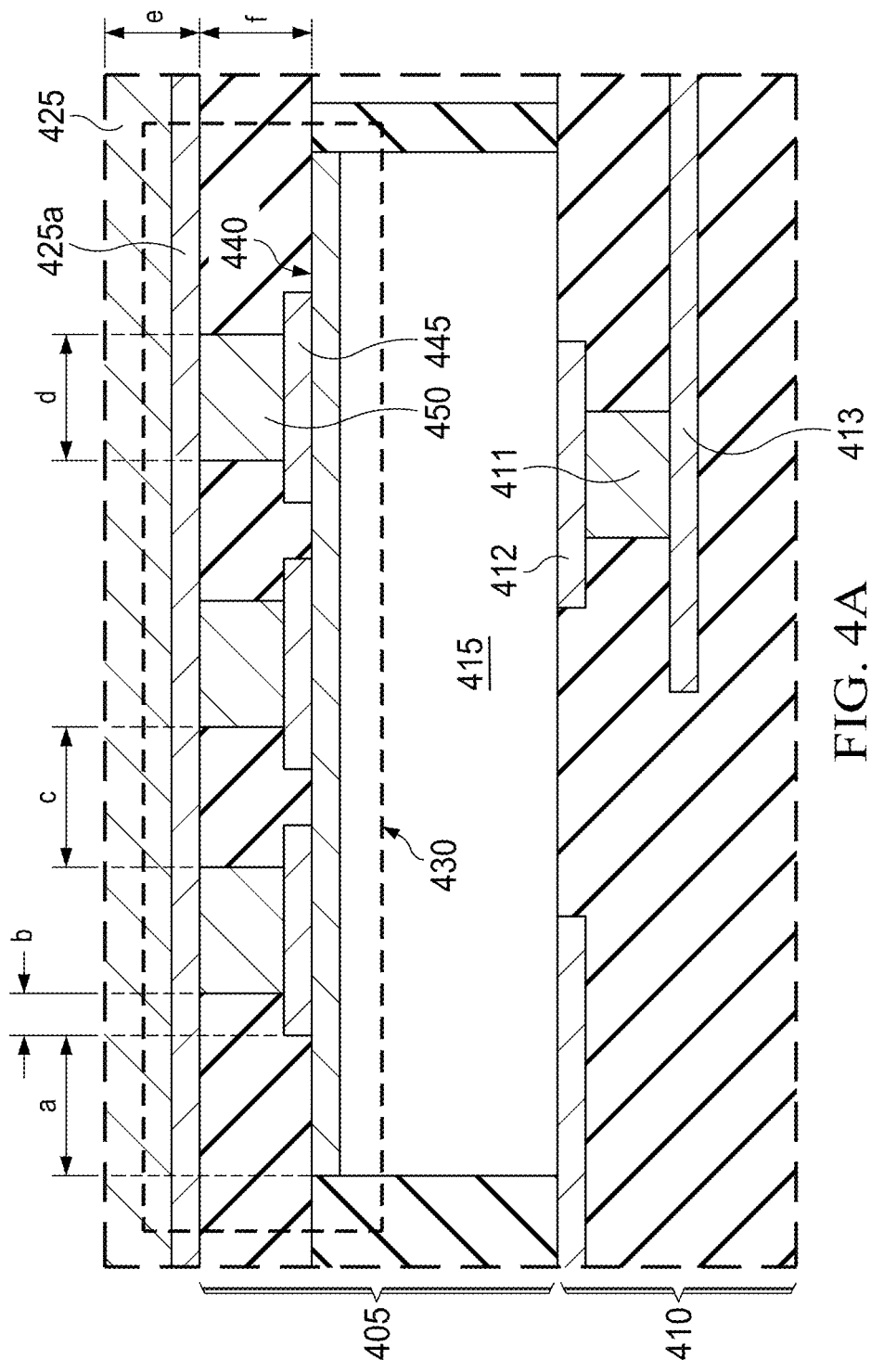
FIG. 4A illustrates a close up cross-sectional view of the stress buffer layer discussed with respect to FIG. 4.

Turning to FIG. 4A, illustrated is a close up cross-sectional view of the stress buffer layer 430 discussed with respect to FIG. 4. This close up view more precisely illustrates the shape and proportion of the conductive pads 445 and the conductive posts 450 creating the stress buffer layer 430. Also shown in this view is that an optional seed layer 425a may also be deposited prior to the heat spreader 425, if desired, with the tops of the conductive posts 450 connected to the seed layer 425a.

In either embodiment, the disclosed principles provide for the creation of a stress buffer layer 430 created by a plating process for forming the conductive pads 445 and the conductive posts 450. The conductive pads 445 having a larger diameter than the conductive posts 450 makes a direct contact to the die 415 (or seed layer 440), and the larger diameter of the pads 445 results in stress distribution per unit area on a die 415 that is substantially smaller than the conventional laser drilled vias discuss above. Additionally, the extra volume of copper (or other desirable conductive material) from larger diameter of the conductive pads 445 also improves thermal performance of a package 400 having a stress buffer layer 430 as disclosed herein.

The design parameters associated with a stress buffer layer 430 as disclosed herein may also be adjusted based on desired thermo-mechanical stress and thermal conductivity performance of the package 400. Dimension (a) is the amount of pull-back from the edge of the die 415 to the outer diameter of an outer conductive pad 445. Dimension (b) is the additional radius from the conductive posts 450 provided by the larger conductive pads 445. Dimension (c) is spacing between the conductive posts 450. Dimension (d) is the diameter of the conductive posts 450. Dimension (e) is the thickness of the heat spreader 425. Dimension (f) is the total height of the conductive pads 445 and the conductive posts 450. Based on these predetermined dimensions, the height of the conductive posts (f) can be selected so as to move the high stress point from the die to a stress buffer layer as disclosed herein. Also, the post diameter (d) combined with the additional lateral radii provided by the larger conductive pad helps to distribute stress to a wider area on the die as compared to narrower conductive vias provide by conventional structures.

FIG. 4B illustrates a chart providing a summary of the design of experiments (DOE) results of the development of thermo-mechanical stress cracks at the interface with an embedded die constructed with a stress buffer layer according to the disclosed principles. More specifically, the DOE results looked at a comparison of the thickness of the heat spreader (e) and the overall height of the conductive posts 450 and conductive pads 445 provided by the disclosed principles. The results demonstrate the trade-off between the thickness of the heat spreader 425 and the total height of the disclosed stress buffer layer 430. For example, the DOE results demonstrated that minimum height of 30 μm for stress buffer layer 430 resulted in no cracks at the die interface for a heat spreader 425 thickness up to about 60 μm. Higher thicknesses for the heat spreader 425 had the tendency to increase the likelihood for cracks to develop. Similarly, if the height of the stress buffer layer 430 is too small, e.g., 15 μm and below, die cracks also tended to develop. Notably, the results proved that the elimination of the stress buffer layer (i.e., 0 μm) with the use of a heat spreader resulted in simply a direct connection of the heat spreader to the embedded die. This is one of the conventional techniques discussed above, and demonstrated the presence of die cracks that typically result with that heat dissipation technique.

Figure 5A:
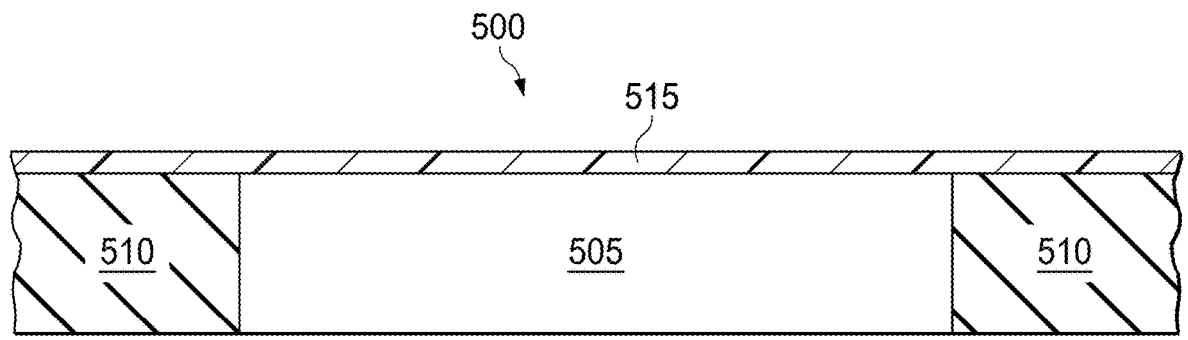
FIGS. 5A-5I illustrate cross-sectional block diagrams of an exemplary process for forming a stress buffer layer for an embedded package, in accordance with the disclosed principles.

Turning now to FIGS. 5A-5I, illustrated are cross-sectional block diagrams of an exemplary process for forming a stress buffer layer for an embedded package 500, in accordance with the disclosed principles. FIG. 5A illustrates the circuit layer of an exemplary package at an intermediate stage of formation. Specifically, the intermediate structure includes an embedded IC die 505 encapsulated with a dielectric package material 510. On top of this intermediate structure, the disclosed process deposits a first mask layer 515. The first mask layer 515 may be a photolithographic mask deposited using conventional photolithographic process; however, other masking technologies, either now existing or later developed, may also be employed. Although not illustrated, a seed layer may also be deposited over the top of the die 505 prior to depositing the first mask layer 515.

Figure 5B:
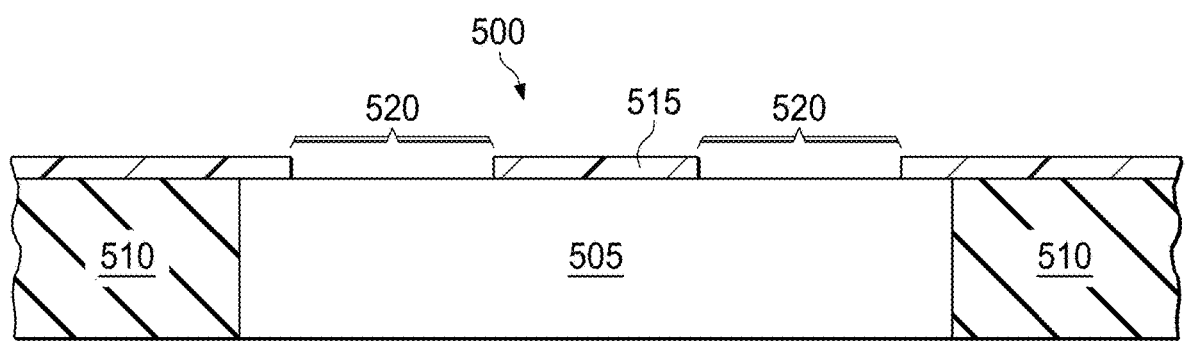

FIG. 5B illustrates a cross-sectional view of the intermediate package structure at a later stage of the disclosed manufacturing process of a stress buffer layer. At this stage, the first mask layer 515 is removed at multiple areas to create first openings 520 exposing non-electrically conductive surfaces of the embedded die 505. For example, photolithography processes may again be used to open select portions of the first mask layer 515. The opened areas of the first mask layer 515, which in advantageous embodiments are substantially circular in shape, provide the locations of the conductive pads for the disclosed stress buffer layer. Moreover, the thickness of the first mask layer 515 is used to set the thickness of the conductive pads in this embodiment.

Figure 5C:
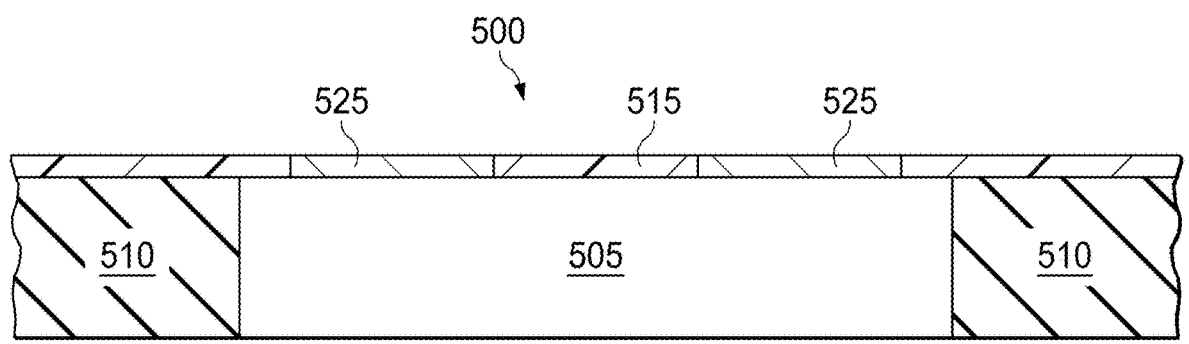

FIG. 5C illustrates a cross-sectional view of the intermediate package structure at a further stage of the disclosed manufacturing process of a stress buffer layer. At this stage of the process, the conductive pads 525 are formed directly on top of corresponding non-electrically conductive surfaces of the die 505. In embodiments where a seed layer is used over the die 505, the conductive pads 525 are formed on the seed layer. To form the conductive pads 525, the disclosed principles may employ a plating process, such as a copper plating process. In other embodiments, the conductive pads 525 may be formed using a deposition technique used in semiconductor manufacturing, or any other advantageous process for metal deposition or formation.

Figure 5D:
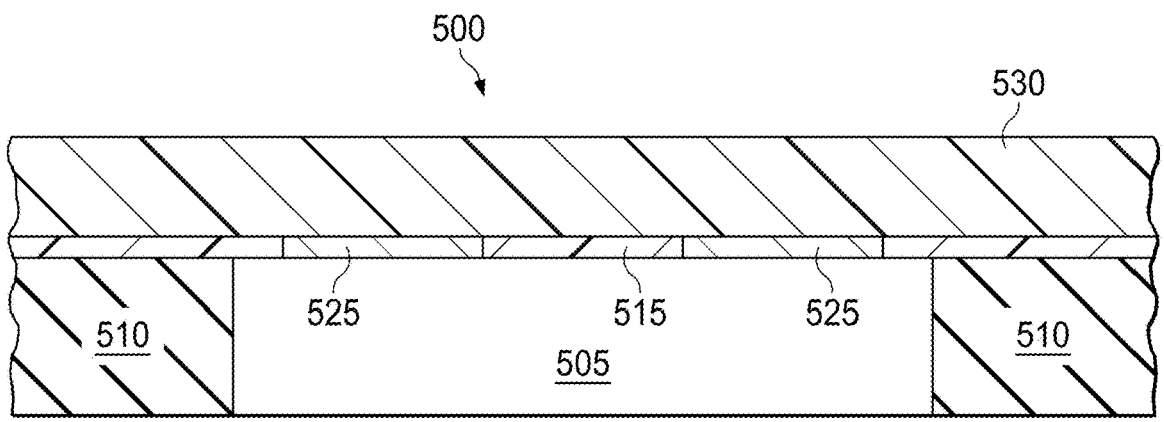

FIG. 5D illustrates a cross-sectional view of the intermediate package structure at an even later stage of the disclosed manufacturing process. At this stage of the disclosed process, a second mask layer 530 is formed over the finished conductive pads 525, as well as the remaining portions of the first mask layer 515. The second mask layer 530 may again be formed using photolithographic processes, or any other advantageous process. In addition, the second mask layer 530 may be formed using the same process as the first mask layer 515, but no such limitation is required. Moreover, as the thickness of the second mask layer 530 is selected to provide the height of the conductive posts of the stress buffer layer, the second mask layer 530 may be comprised of a different material than the first mask layer 515, and thus be deposited or otherwise formed using a different process.

Figure 5E:
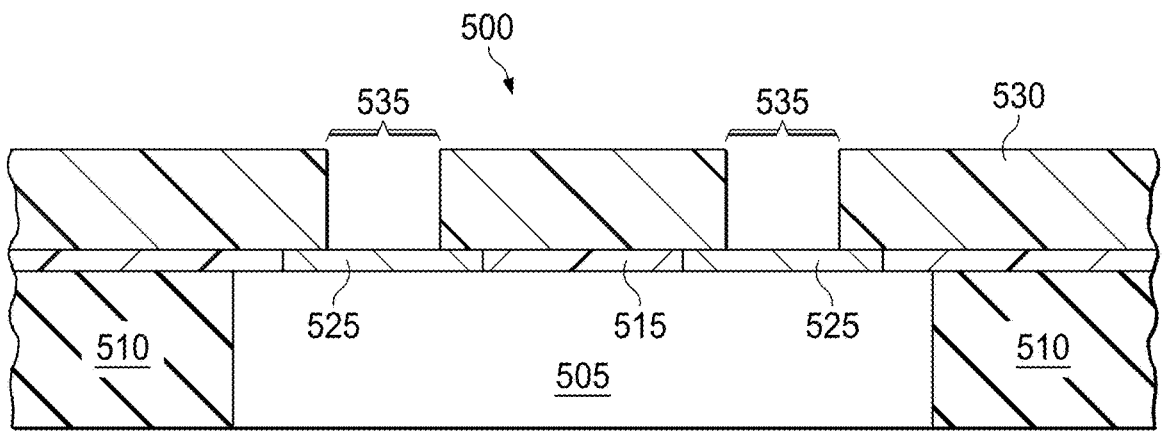

FIG. 5E illustrates a cross-sectional view of the intermediate package structure at a further stage of the disclosed manufacturing process of a stress buffer layer. At this stage, the second mask layer 530 is removed at multiple areas to create second openings 535 exposing portions of the previously formed conductive pads 525. As before, photolithography processes may again be used to open select portions of the second mask layer 530. The openings 535 of the second mask layer 530, which may again also be substantially circular in shape, provide the precise locations and shapes of the conductive posts 540 with respect to the conductive pads 525, and thus may be centered over the conductive pads 525.

Figure 5F:
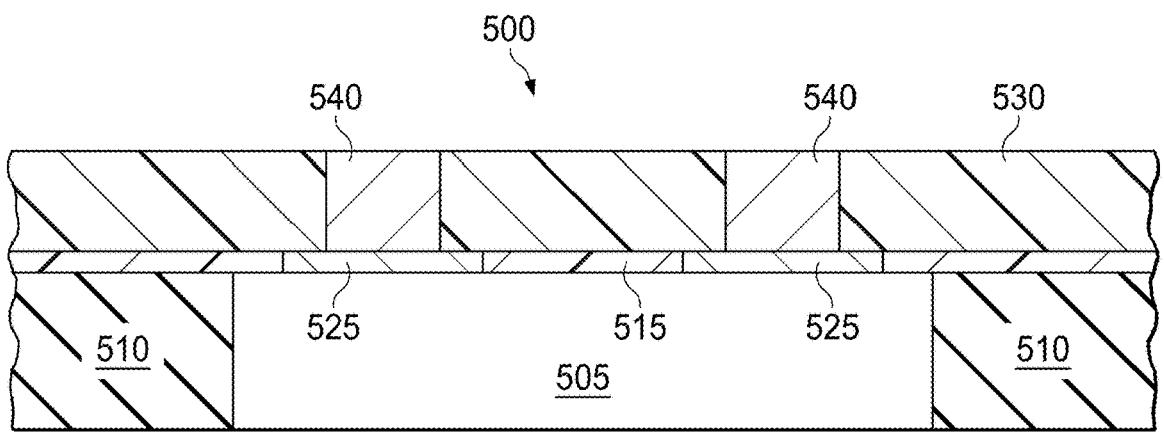

FIG. 5F illustrates a cross-sectional view of the intermediate package structure at a further stage of the disclosed manufacturing process of a stress buffer layer. During this stage of the disclosed process, the conductive posts 540 are created within the second openings 535 in the second mask layer 530. As with the conductive pads 525, the posts 540 may be created using a plating process, such as a copper plating process. In other embodiments, the posts 540 may be formed using a deposition technique used in semiconductor manufacturing or another advantageous process for metal deposition or formation. As illustrated, the height of the posts 540 is determined by the thickness of the second mask layer 530. Moreover, as with the conductive pads 525, the posts 540 may also be formed in a cylindrical shape; however, other shapes for the posts 540 may also be used.

Figure 5G:
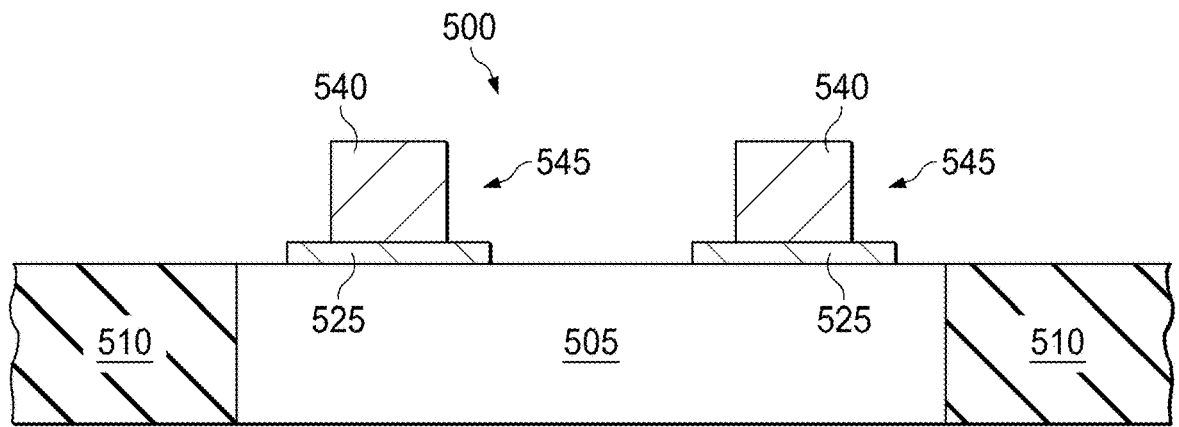
Figure 5H:
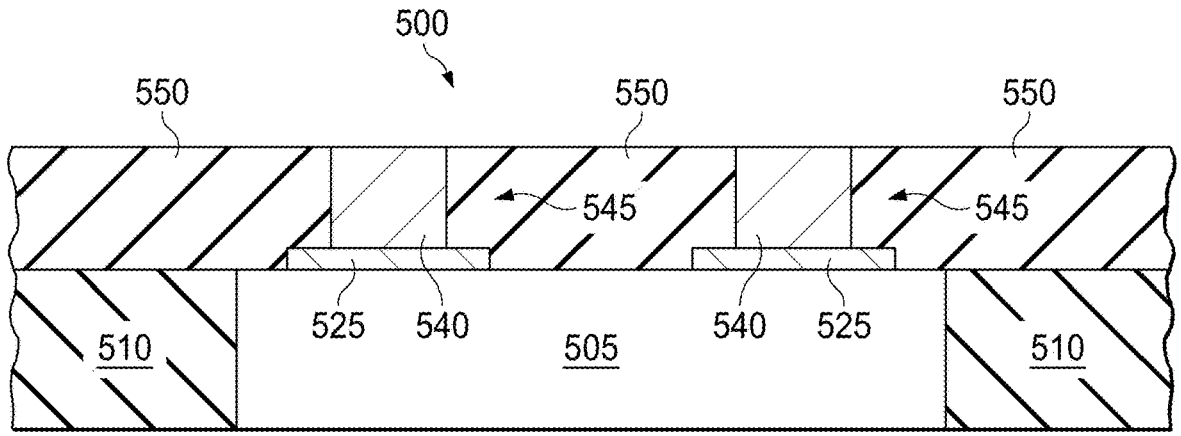

FIG. 5G illustrates a cross-sectional view of the intermediate package structure at a further stage of the disclosed manufacturing process of a stress buffer layer. At this stage, after the formation of the completed stress buffer layer 545 (a combination of the conductive pads 525 and conductive posts 540), the first and second masks 515, 530 are then stripped or otherwise removed from the structure. Conventional techniques for removing the masks 515, 530 may be employed. FIG. 5H illustrates a cross-sectional view of the intermediate package structure further in the process. Specifically, this stage comprises the deposition of the encapsulating dielectric material 550 used to embed the die 505 and other components in the circuit layer of the package 500. Any technique for providing the dielectric material 550 may be employed, either now existing or later developed.

Figure 5I:
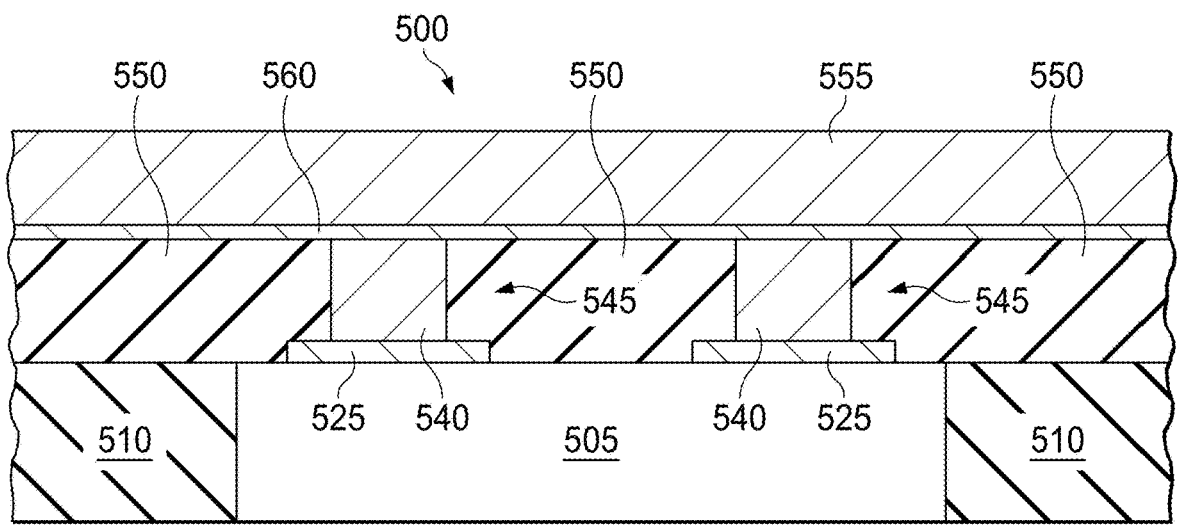

FIG. 5I illustrates a cross-sectional view of the package 500 after the disclosed manufacturing process is completed. At this stage of the disclosed process, the heat spreader 555 is formed on top of the dielectric material 550. To form the heat spreader 555, a plating process or other material deposition process may be employed. The heat spreader 555 is either placed in direct contact with the tops of the components of the stress buffer layer 545, or alternatively a conductive seed layer 560 may first be deposited over the dielectric material 550 and in contact with the tops of the stress buffer layer 545, and then the heat spreader 555 formed directly on top of the seed layer 560. Moreover, a distal surface of the heat spreader 555 is left exposed from the encapsulating dielectric material 550 so as to transfer heat out of the package 500. In exemplary embodiments, the heat spreader 555 is formed of copper; however, other metallic or conductive material may also be employed, if desired. In addition, the seed layer 560, if present, may also be formed from the same material as the heat spreader 555, or another advantageous material may be employed.

Figure 6:
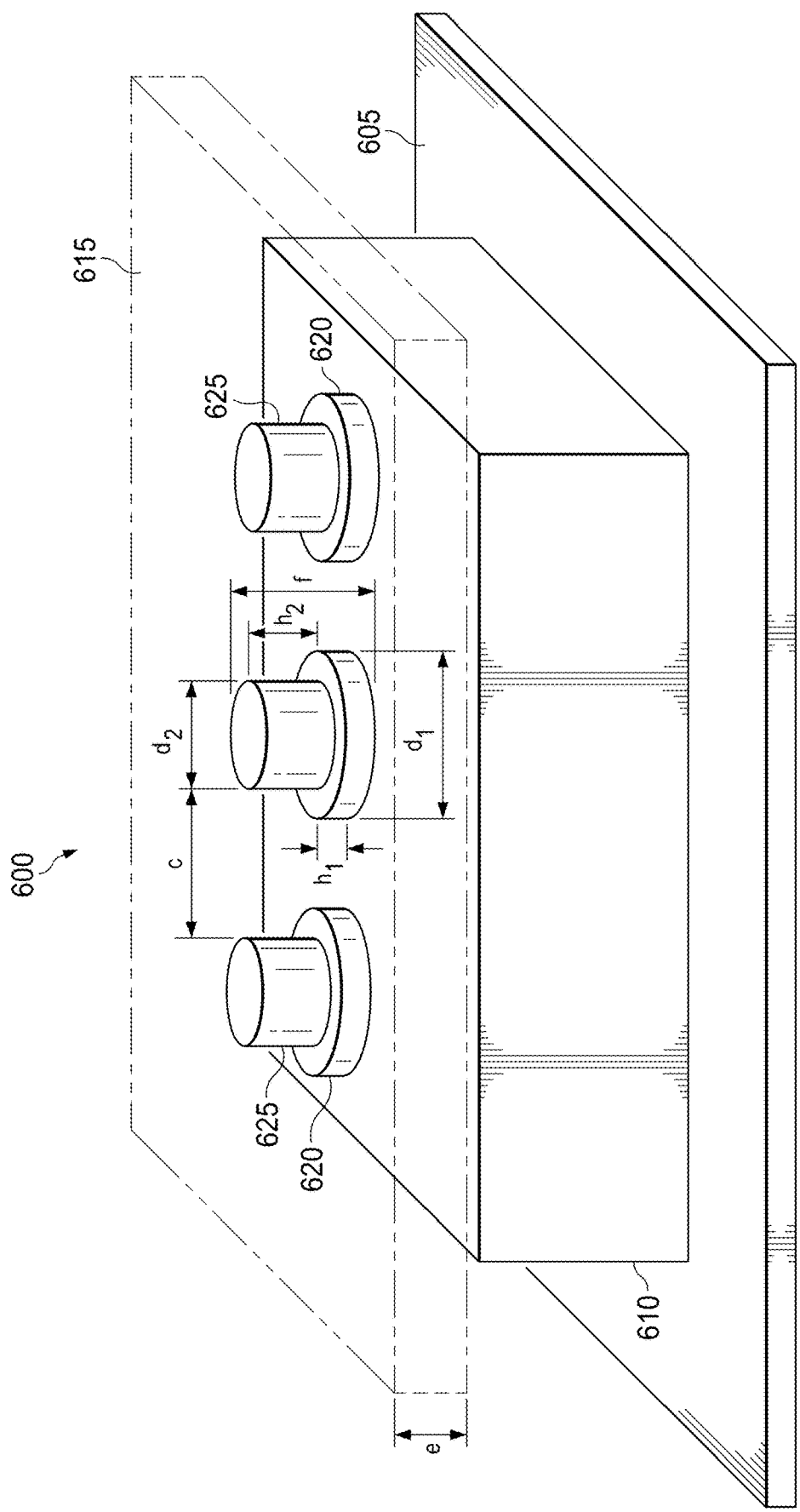
FIG. 6 illustrates a 3D view of an embedded package having one embodiment of a stress buffer layer in accordance with the disclosed principles.

Turning now to FIG. 6, illustrated is a 3D view of an embedded package 600 having one embodiment of a stress buffer layer in accordance with the disclosed principles. The package 600 again includes an RDL 605 and an encapsulated IC die 610 in a circuit layer of the package 600. Also illustrated is a stress buffer layer manufactured as disclosed herein to thermally connect the die 610 with a heat spreader 615. The stress buffer layer is formed by pairs of conductive pads 620 and corresponding conductive posts 625, which in this exemplary embodiment are substantially equally spaced above the upper non-electrically conductive surfaces of the die 610. However, other spacing arrangements or layouts for the pairs of conductive pads 620 and conductive posts 625 may also be employed.

The stress buffer layer is comprised conductive pads 620 formed directly on the top surface of the die 610, such that proximal ends of the conductive pads 620 are in contact with the die 610. As before, an optional seed layer may also be used between the pads 620 and the die 610. The conductive pads 620, in this embodiment, are formed of copper and into a substantially cylindrical shape to a predetermined diameter ($d_1$) and to a predetermined height ($h_1$). Formed on top of each conductive pad 620 is a conductive post 625, such that the proximal ends of the conductive posts 625 contact the distal ends of the conductive pads 620. The conductive posts 625 are also formed of copper and have a substantially cylindrical shape. The conductive posts 625 are formed to a predetermined diameter ($d_2$) and to a predetermined height ($h_2$). Once each pair of the conductive posts 625 are formed on corresponding conductive pads 620, the overall height (f) of the stress buffer layer is established. Additionally, the spacing (c) of the conductive posts 625 may also be predetermined for the stress buffer layer. In an exemplary embodiment, the overall height (f) of the stress buffer layer may be in the range of 30 µm-60 µm, with the height ($h_1$) of the conductive pads 620 in the range of about 5 µm-20 µm and the height ($h_2$) of the conductive posts 625 in the range of about 10 µm-50 µm. In such embodiments, the heat spreader 615 may have a height (e) in the range of 15 µm-60 µm. In a more specific embodiment, the overall height (f) of the stress buffer layer may be about 40 µm, and the height (e) of the heat spreader 615 may also be about 40 µm. In such embodiments, the height ($h_1$) of the conductive pads 620 may be about 10 µm with the height ($h_2$) of the conductive posts 625 about 30 µm. Thus, the ratio for the height ($h_1$) of the pads 620 as compared to the height ($h_2$) of the conductive posts 625 may be about 3:1; however, other height ratios for these two components may also be used.

Figure 7:
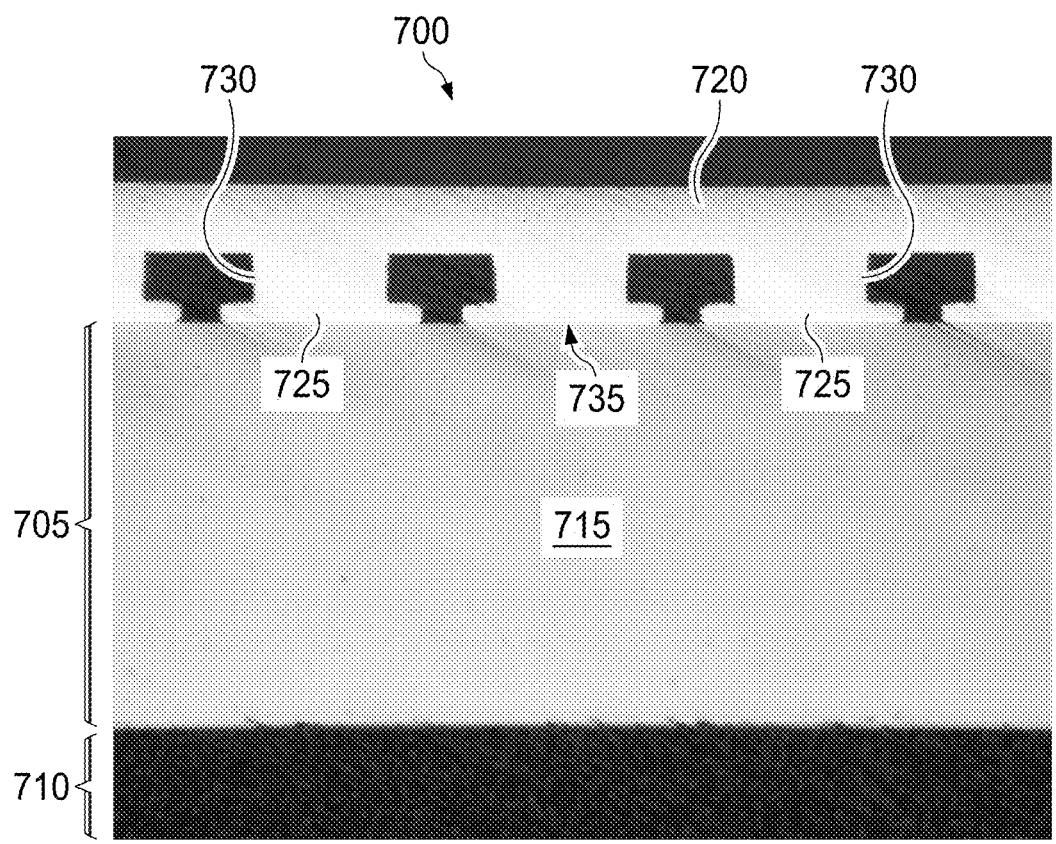
FIG. 7 provides an image from a scanning electron microscope of an embedded package employing a stress buffer layer in accordance with the disclosed principles.

Turning finally to FIG. 7, provided is an image from a scanning electron microscope of a portion of an embedded package 700 employing a stress buffer layer in accordance with the disclosed principles. As before, the package 700 includes a circuit layer 705 and an RDL 710, with an embedded IC die 715 encapsulated in the circuit layer 705. Also within the circuit layer 705 is a stress buffer layer as disclosed herein providing a thermal connection between the top non-electrically conductive surface of the die 715 and a heat spreader 720. The heat spreader 720 also has its distal surface exposed from the package 700.

The stress buffer layer is shown as again comprising pads 725 formed on the die 715, and conductive posts 730 formed on top of the pads 725. In exemplary embodiments, both the pads 725 and posts 730 may again be formed having cylindrical shapes, but other shapes may also be formed for either or both of these components of the stress buffer layer. The image in FIG. 7 was taken after the package 700 had gone through IR reflow, in the manner discussed above. Notably, the interface 735 of the pads 725 and the non-electrically conductive surface of the die 715 does not have any cracks visible in the SEM image. Consequently, the thermal conductivity of the stress buffer layer can sufficiently dissipate heat from the die 715 due to its maintained structural integrity despite the package 700 having gone through the IR reflow process.

While this invention has been particularly shown and described with reference to preferred embodiments, it will be understood by those skilled in the art that various changes in form and detail may be made therein without departing from the spirit and scope of the invention. The inventors expect skilled artisans to employ such variations as appropriate, and the inventors intend the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

While various embodiments in accordance with the principles disclosed herein have been described above, it should be understood that they have been presented by way of example only, and not limitation. Thus, the breadth and scope of this disclosure should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, and by way of example, although the headings refer to a "Technical Field," the claims should not be limited by the language chosen under this heading to describe the so-called field. Further, a description of a technology as background information is not to be construed as an admission that certain technology is prior art to any embodiment(s) in this disclosure. Neither is the "Brief Summary of the Invention" to be considered as a characterization of the embodiment(s) set forth in issued claims. Furthermore, any reference in this disclosure to "invention" in the singular should not be used to argue that there is only a single point of novelty in this disclosure. Multiple embodiments may be set forth according to the limitations of the multiple claims issuing from this disclosure, and such claims accordingly define the embodiment(s), and their equivalents, that are protected thereby. In all instances, the scope of such claims shall be considered on their own merits in light of this disclosure, but should not be constrained by the headings set forth herein.

What is claimed is:

1. An integrated circuit (IC) package, comprising:
    a plurality of pads over an IC die within the IC package, each of the plurality of pads contacting a non-electrically conducting surface of the IC die;
    a plurality of posts directly on each of the plurality of pads, wherein each of the plurality of posts has a lateral width less than a lateral width of its corresponding pad of the plurality of pads; and
    a heat spreader attached to the plurality of posts, the heat spreader including a surface exposed from the IC package.

2. The IC package according to claim 1, wherein each of the plurality of pads and each of the plurality of posts comprise copper.

3. The IC package according to claim 1, wherein each of the plurality of posts comprise a substantially cylindrical shape.

4. The IC package according to claim 1, wherein each of the plurality of posts are substantially equally spaced.

5. The IC package according to claim 1, wherein a height of each pair of the plurality of pads and corresponding plurality of posts together is in the range of 30 µm-60 µm when a height of the heat spreader is in the range of 15 µm-60 µm.

6. The IC package according to claim 1, wherein a height of each pair of the plurality of pads and corresponding plurality of posts together is about 40 µm when a height of the heat spreader is about 40 µm.

7. The IC package according to claim 1, wherein a ratio for a height of each of the plurality of posts to a height of each corresponding pads is about 3:1.

8. The IC package according to claim 1, further comprising a seed layer formed between the non-electrically conducting surfaces of the IC die and each of the plurality of pads.

9. A method for manufacturing a heat dissipation structure for use in dissipating heat within an integrated circuit (IC) package, the method comprising:
    depositing a first mask layer over an IC die within the IC package;
    removing areas of the first mask layer to create first openings exposing corresponding non-electrically conducting surfaces of the IC die;
    forming a pad in each of the first openings over the exposed corresponding non-electrically conducting surfaces of the IC die and to a height of the first mask layer;
    depositing a second mask layer over each pad and remaining portions of the first mask layer;
    removing areas of the second mask layer to create second openings, each exposing only a part of a corresponding pad;
    forming a post in each of the second openings directly on the exposed part of each corresponding pad;
    removing the first and second mask layers;

depositing a dielectric material over the IC die, pads, and posts to a height of the posts; and forming a heat spreader on the dielectric material and the posts, and with a distal surface of the heat spreader exposed from the dielectric material.

10. The method according to claim 9, wherein depositing a first mask layer and removing areas of the first mask layer, and depositing a second mask layer and removing areas of the second mask layer, comprise a photolithographic process.

11. The method according to claim 9, wherein forming a pad in each of the first openings and forming a post in each of the second openings comprises a plating process.

12. The method according to claim 9, wherein the pads and posts comprise copper.

13. The method according to claim 9, further comprising forming a seed layer on the non-electrically conductive surface of the IC die prior to depositing the first mask layer.

14. The method according to claim 9, further comprising forming a seed layer on the dielectric material and the posts prior to forming the heat spreader.

15. An integrated circuit (IC) package, comprising:
an IC die having electrically conducting bond pads and non-electrically conducting surfaces distributed on an exterior of the IC die;
electrically conductive vias connected to one or more of the electrically conducting bond pads;
a stress buffer layer, comprising:
a plurality of pads laterally distributed over an IC die in an IC package, each of the plurality of pads having a proximal end contacting one of the non-electrically conducting surfaces of the IC die, and having a distal end opposite each proximal end of each the plurality of pads; and
a plurality of posts laterally distributed directly on each of the plurality of pads, each of the plurality of posts having a proximal end contacting respective distal ends of each pad of the plurality of pads, and having a distal end opposite each proximal end of each of the plurality of posts, wherein each post has a lateral width less than a lateral width of its corresponding pad; and
a heat spreader having a proximal surface contacting the distal ends of the plurality of posts, and having a distal surface exposed from the IC package.

16. The IC package according to claim 15, wherein each of the plurality of pads and each of the plurality of posts comprise copper.

17. The IC package according to claim 15, further comprising a drive IC electrically connected to the IC die within the IC package.

18. The IC package according to claim 15, wherein a height of each pair of the plurality of pads and corresponding plurality of posts together is about 40 µm when a height of the heat spreader is about 40 µm.

19. The IC package according to claim 15, wherein a ratio for a height of each of the plurality of posts to a height of each corresponding pads is about 3:1.

20. The IC package according to claim 15, further comprising a seed layer formed between the non-electrically conducting surfaces of the IC die and each of the plurality of pads.

* * * * *